United States Patent
Xu et al.

(10) Patent No.: US 6,892,669 B2
(45) Date of Patent: *May 17, 2005

(54) CVD APPARATUS

(75) Inventors: Ge Xu, Tokyo (JP); Hiroshi Nogami, Tokyo (JP)

(73) Assignee: Anelva Corporation, Fuchu (JP)

(*) Notice: Subject to any disclaimer, the term of this patent is extended or adjusted under 35 U.S.C. 154(b) by 479 days.

This patent is subject to a terminal disclaimer.

(21) Appl. No.: 09/863,338

(22) Filed: May 24, 2001

(65) Prior Publication Data

US 2001/0042512 A1 Nov. 22, 2001

Related U.S. Application Data

(63) Continuation of application No. 09/435,625, filed on Nov. 8, 1999, which is a continuation of application No. 09/255,852, filed on Feb. 23, 1999, now Pat. No. 6,245,396.

(30) Foreign Application Priority Data

| Feb. 26, 1998 | (JP) | ............................................. 10-62066 |
| Feb. 1, 1999 | (JP) | ............................................. 11-23887 |
| Jun. 4, 1999 | (JP) | .......................................... 11-157692 |

(51) Int. Cl.$^7$ .......................................... H01L 21/205
(52) U.S. Cl. ................. 118/723 E; 156/345.43
(58) Field of Search ........................... 118/715, 723 IE, 118/723 R, 723 E, 723 AN, 723 I, 723 IR; 156/345.43, 345.47, 345.33, 345.34; 315/111.21

(56) References Cited

U.S. PATENT DOCUMENTS

| 4,792,378 A | 12/1988 | Rose et al. |
| 5,336,326 A | 8/1994 | Karner et al. |
| 5,433,786 A | 7/1995 | Hu et al. ................. 118/723 E |
| 5,433,787 A | 7/1995 | Suzuki |
| 5,449,410 A | 9/1995 | Chang |
| 5,472,565 A | 12/1995 | Mundt et al. ................. 216/71 |
| 5,525,159 A | 6/1996 | Hama et al. |
| 5,556,474 A | 9/1996 | Otani et al. |
| 5,624,498 A | 4/1997 | Lee et al. .................... 118/715 |

(Continued)

FOREIGN PATENT DOCUMENTS

| JP | 5-21393 | 1/1993 |
| JP | 6-260434 | 9/1994 |
| JP | 7-201749 | 8/1995 |
| JP | 8-167596 | 6/1996 |
| JP | 2837087 | 10/1998 |

OTHER PUBLICATIONS

Robert C. Reid et al. "Lennard–Jones Potentials as Determined from Viscosity Data (Appendix B)", *The Properties of Gases and Liquids*, McGraw–Hill, Inc., Copyright 1987, p. 734, Index.

(Continued)

Primary Examiner—P. Hassanzadel
Assistant Examiner—Sylvia R. MacArthur
(74) Attorney, Agent, or Firm—Burns, Doane, Swecker & Mathis, L.L.P.

(57) ABSTRACT

A CVD apparatus produces plasma to generate radicals and uses the radicals, silane, and the like so as to deposit films on substrates in a vacuum vessel 12. The vacuum vessel has a partitioning wall section 14 for separating the inside thereof into a plasma-generating space 15 and a film deposition process space 16. The partitioning wall section has a plurality of through-holes 25 and diffusion holes 26. An interior space 24 receives the silane or the like fed into the film deposition process space through diffusion holes 16. The radicals produced in the plasma-generating space are fed into the plasma-generating space through the through-holes. The through-holes satisfy the condition of uL/D>1, where u represents the gas flow velocity in the through-holes, L represents the effective length of the through-holes, and D represents the inter-diffusion coefficient.

31 Claims, 3 Drawing Sheets

U.S. PATENT DOCUMENTS

| | | | |
|---|---|---|---|
| 5,766,364 A | | 6/1998 | Ishida et al. ............. 118/725 |
| 5,863,339 A | * | 1/1999 | Usami ................. 118/723 E |
| 5,942,075 A | | 8/1999 | Nagahata et al. |
| 6,026,764 A | | 2/2000 | Hwang |
| 6,074,518 A | | 6/2000 | Imafuku et al. |
| 6,086,677 A | | 7/2000 | Umotoy et al. ........... 118/715 |
| 6,203,620 B1 | | 3/2001 | Moslehi ............... 118/723 R |
| 6,245,192 B1 | | 6/2001 | Dhindsa et al. ....... 156/345.34 |
| 6,245,396 B1 | * | 6/2001 | Nogami ................. 427/562 |
| 6,302,964 B1 | | 10/2001 | Umotoy et al. ........... 118/715 |
| 6,368,987 B1 | | 4/2002 | Kopacz et al. ............ 438/788 |
| 6,435,428 B2 | | 8/2002 | Kim et al. ................ 239/553 |

OTHER PUBLICATIONS

R. Byron Bird et al. "Diffusivity and the Mechanisms of Mass Transport; Theory of Ordinary Diffusion in Gases at Low Density", *Transport Phenomena*, John Wiley & Sons, Inc., Copyright 1960, p. 508–513.

"Flow of Atoms and Molecules—Rarefied Gas Dynamics and its Applications", section 2.6.4, The Japan Society of Mechanical Engineers, 1996, Kyoritsu Shuppan Co., Ltd.

Shingo Kadomura et al., Anisotropic Etching Using Deposition of Sulfur, Sony Corporation, Semiconductor World, Jan. 1993, pp. 1–11, and translation.

Ken Fujita et al., "X–Ray Photoelectron Spectroscopic Studies on Pyrolysis of Plasma– Polymerized Fluorocarbon Films on SI", Jpn. J. Appl. Phys. vol. 34 (1995), pp. 304–306, Part 1, No. 1, Jan. 1995.

Riccardo d'Agostino et al., "Plasma Etching of Si and $SiO_2$ in $SF_6$–$O_2$ Mixtures", J. Appl. Phys. 52(1), Jan. 1981, pp. 162–167.

A new technique for diagnostics of a radio–frequency parallel–plate remote plasma; N. Sano et al.; Appl. Phys. Lett 65 (2), Jul. 11, 1994 pp. 162–164.

Infrared spectroscopic study of $SiO_x$ films produced by plasma enhanced chemical vapor deposition; J. Vac.Sci. Technol. A4(3), May/Jun. 1986; pp. 689–694.

Improvement of structural and electrical properties in low-temperature gate oxides for poly–Si TFTs by controlling $O_2$/$Sih_4$ ratios; AM–LCD 1997; pp. 87–90.

"Lennard–Jones Potentials as Determined from Viscosity Data (Appendix B)", *The Properties of Gases and Liquids*, McGraw–Hill, Inc., Copyright 1987, p. 734.

"Diffusivity and the Mechanisms of Mass Transport; Theory of Ordinary Diffusion in Gases at Low Density", *Transport Phenomena*, John Wiley & Sons, Inc., Copyright 1960, p. 508–511.

* cited by examiner

CVD APPARATUS

CROSS-REFERENCE TO RELATED APPLICATIONS

This application is a continuation application of U.S. Ser. No. 09/435,625, filed on Nov. 8, 1999, and U.S. Ser. No. 09/255,852, filed on Feb. 23, 1999, now U.S. Pat No. 6,245,396 the entire contents of both applications are hereby incorporated herein by reference. This application also claims the priority of Japanese Patent Application No. 11-157692, filed in Japan on Jun. 4, 1999; Japanese Patent Application No. 11-23887, filed in Japan on Feb. 1, 1999; and Japanese Patent Application No. 10-62066, filed in Japan on Feb. 26, 1998; the entire contents of which are hereby incorporated herein by reference.

BACKGROUND OF THE PRESENT INVENTION

1. Field of the Invention

The present invention relates to a CVD apparatus, and particularly, to a CVD apparatus suitable for depositing films on large flat-panel substrates.

2. Description of the Related Art

Conventionally, known production methods for large liquid crystal displays include a method which uses high-temperature polysilicon TFTs (thin film transistors) and a method which uses low-temperature polysilicon TFTs. The production method employing the high-temperature polysilicon TFTs uses a quartz substrate that withstands high temperatures of 1,000° C. or more to produce high-quality oxide films. On the other hand, the method employing the low-temperature polysilicon TFTs uses a glass substrate as is generally used for TFTs, requiring film deposition to be performed in a lower-temperature environment (for example, 400° C.). The production method for liquid crystal displays using the low temperature polysilicon TFT has the advantage of not requiring use of a special substrate. This method, therefore, has come into practical use in recent years, enjoying a continuous increase in the production.

In the production of liquid crystal displays that employs the low-temperature polysilicon TFTs, plasma-enhanced CVD is adopted in the low-temperature deposition of silicon oxide films suitable as gate insulation films. The deposition of silicon oxide films with the plasma-enhanced CVD uses a gas such as silane or tetraethoxysilane (TEOS) as a typical reactive gas.

In the deposition of silicon oxide films with the plasma-enhanced CVD by use of silane as the reactive gas, conventional plasma-enhanced CVD apparatuses perform the film deposition in the following manner. Gases, such as a reactive gas and oxygen, are fed in a front-side space of a substrate, a gas mixture of the reactive gas and the oxygen is used to produce a plasma, and the substrate is then exposed to the plasma so as to form the silicon oxide film on the surface of the substrate. In this way, the conventional plasma-enhanced CVD apparatuses are configured to allow the reactive gas to feed directly into the plasma produced in the plasma-enhanced CVD apparatuses. When using a conventional plasma-enhanced CVD apparatus, problems may arise when high-energy ions are implanted on film deposition surfaces from the plasma existing in the front-surface space of the substrate. Such action causes damage to the silicon oxide films, and film characteristics are reduced. In addition, since the reactive gas is fed directly in the plasma, the reactive gas and oxygen react vigorously, producing dust particles. This causes a problem in that the yield is reduced.

To overcome the above problems, as an example of conventional cases, there is a proposal for a plasma-processing apparatus that uses a plasma-isolating method. In the plasma-isolating method, a configuration is used so that short-lived charged particles isolated from a plasma-producing region of a plasma apparatus disappear, and a substrate is placed in a region where radicals which live relatively long predominantly exist, and concurrently, a reactive gas is fed close to the region in which the substrate is placed. The radicals produced in the plasma region diffuse toward the region in which the substrate has been placed and are fed into a front-surface space of the substrate. In the above plasma-processing apparatus of the plasma-isolating method, advantages are provided in that vigorous reaction between the plasma and the reactive gas is suppressed, dust particles are reduced, and in addition, implantation of ions into the substrate is restricted.

Also, conventionally, a plasma-enhanced CVD apparatus is proposed in Japanese Unexamined Patent Publication No. 6-260434 (Japanese Patent No. 2,601,127). The proposed plasma-enhanced CVD apparatus has a parallel-flat-plate type electrode structure. In this configuration, an intermediate electrode is arranged between a radio-frequency electrode and a substrate-holder electrode, partitioning a space between the radio-frequency electrode and the substrate-holder electrode. Concurrently, RF power is supplied only between the radio-frequency electrode and the substrates-holder electrode. In this manner, a plasma discharge is generated only between the radio-frequency electrode and the substrate-holder electrode, and excited active species and ions which have been generated by the plasma discharge are fed into a front-surface space of a substrate through through-holes formed in the intermediate electrode. The radio-frequency electrode is of a conventional shower-head type, and a plasma-producing gas is fed into a plasma-generating space through a plurality of holes formed in a diffusion plate. The reactive gas is fed into the front-surface space of the substrate through gas-feeding spaces and gas-discharging openings which are formed in the intermediate electrode. This plasma-enhanced CVD apparatus has a configuration in which the space between the radio-frequency electrode and the substrate-holder electrode is partitioned by means of the intermediate electrode, and only the space between the radio-frequency electrode and the intermediate electrode is formed as the plasma-generating space. As a result, the plasma-producing region is isolated from a position where the substrate is placed. This plasma-enhanced CVD apparatus can be considered to be a modification of the apparatus of the plasma-isolating method which has the parallel-flat-plate type electrode structure.

Also proposed conventionally is a plasma-enhanced CVD apparatus in accordance with Japanese Unexamined Patent Publication No. 5-21393. The proposed plasma-enhanced CVD apparatus has a plasma-producing chamber and a substrate-processing chamber inside a vacuum vessel that forms the CVD apparatus of the parallel-flat-plate type, and has a mesh plate at a border section between the chambers.

Furthermore, conventionally, a plasma-processing apparatus is proposed according to Japanese Unexamined Patent Publication No. 8-167596. This plasma-processing apparatus has a vacuum vessel in which a metal mesh plate and a support member therefor is arranged to separate the inside space into a plasma-producing chamber and a plasma-processing chamber. According to this plasma-processing apparatus, the diameter of a plurality of openings formed in the mesh plate is determined to be twice as large as the Debye length of a plasma produced in the plasma producing chamber. This shields charged particles in the plasma, and excited atomic species which are electrically neutral are emitted on a processed object.

In the plasma-processing apparatus of the plasma-isolating method, as described above, the plasma producing region and the substrate-placing region are isolated by a communication space. Also, the radicals produced in a region isolated from the substrate travel through the communication space, and using effects of diffusion occurring therein, the radicals are fed onto the surface of the substrate. Therefore, problems arise in that the deposition speed is reduced, and the distribution of the radicals is not suitable in the vicinity of the surface of the substrate. Particularly, the fact that the distribution of the radicals is not suitable has given rise to a problem in that the capacity does not meet requirements for large-surface substrates used for large liquid crystal displays.

According to the plasma-enhanced CVD apparatus disclosed in Japanese Unexamined Patent Publication No. 6-260434 (Japanese Patent No. 2,601,127), advantages are highlighted as follows. The reactive gas is not supplied to the plasma-generating space between the radio-frequency electrode and the intermediate electrode. Therefore, no chemical reactions occur around the radio-frequency electrode, films are not accumulated on the radio-frequency electrode, and furthermore, dust particles are not formed. According to careful investigation, however, no particular considerations are exerted on the dimensions of the through-holes formed on the intermediate electrode. In this case, a possibility remains in that the reactive gas will diffuse back into the plasma-generating space. Therefore, there is a probability that the reactive gas will enter into an upper side of the intermediate electrode, causing chemical reactions around the radio-frequency electrode.

In the plasma-enhanced CVD apparatus disclosed in Japanese Unexamined Patent Publication No. 5-21393 also, the determined dimensions of the through-holes formed in the mesh plate are such that the reactive gas may diffuse back into the plasma-generating space, causing the same problem as in the above case.

The plasma-processing apparatus disclosed in Japanese Unexamined Patent Publication No. 8-167596 has a configuration in which movement of charged particles from the plasma-generating space to the plasma-processing chamber is blocked. However, there is no description regarding a configuration that will avoid a possibility that the reactive gas which has been fed into the plasma-processing chamber so as not to contact the plasma will diffuse back into the plasma-generating chamber through the plurality of openings formed in the mesh plate. Therefore, there is a possibility that the reactive gas will enter into the plasma-generating chamber through the mesh plate, causing chemical reactions with the plasma.

OBJECTS AND SUMMARY

The present invention is to overcome the above problems and to provide a CVD apparatus that can be used effectively for the deposition of films on large-surface substrates. The apparatus can be used in cases in which silicon oxide films are deposited on large-surface substrates according to plasma-enhanced CVD by using a reactive gas such as silane in the production of large liquid crystal displays that use low temperature polysilicon type TFTs. For this, the plasma-enhanced CVD apparatus is configured so as to minimize the probability of contact between plasma and a reactive gas in a stage prior to the film deposition, sufficiently suppressing formation of dust particles, avoiding implantation of ions into the substrate, and allowing radicals to be distributed sufficiently in the vicinity of the substrate.

The CVD apparatus according to one embodiment of the present invention produces plasma to generate active species (radicals) and deposits films on a substrate in a vacuum vessel by using the active species and the reactive gas. The vacuum vessel has an electrically conductive partitioning wall section for separating the inside thereof into two chambers. The inside of one of the two chambers is formed as a plasma-generating space containing a radio-frequency electrode; the inside of the other chamber is formed as a film deposition process space containing a substrate support mechanism for mounting the substrate. Also, a plurality of through-holes is formed in the partitioning wall section to allow communication between the plasma-generating space and the film deposition process space. Also, the partitioning wall section has an interior space separated from the plasma-generating space and communicating with the film deposition process space through a plurality of diffusion holes. In the interior space, the reactive gas is supplied from the outside, and the reactive gas thus supplied into the interior space is fed into the film deposition process space through the plurality of diffusion holes. The dimensions (the length, the diameter, and the like) of the through-holes or the diffusion holes are designed so as to satisfy the particular condition as described below.

In the above-described CVD apparatus, the plurality of through-holes formed in the partitioning wall section satisfies the condition of $uL/D > 1$, where u represents the gas flow velocity in the holes, L represents the effective hole length, and D represents the inter-diffusion coefficient. Also, the plurality of diffusion holes preferably satisfies the same condition as described above.

The condition described above, which is to be satisfied by the through-holes formed on the partitioning wall section, is determined so that if it is assumed that the gas in the plasma-generating space and the reactive gas move to opposing sides through the holes, respectively, by mass flow and diffusion, the movement amount by diffusion is restricted.

In the above CVD apparatus, the partitioning wall section has preferably a diffusing structure of at least two phases for diffusing the reactive gas equally in the interior space.

In a configuration that uses an oxygen gas to produce the plasma and uses the reactive gas such as silane to deposit films on the substrate, the above CVD apparatus employs an arrangement in which the interior space of the vacuum vessel which is a processing chamber is separated by the partitioning wall section into the plasma-generating space and the film deposition process space so that a processing surface of the substrate placed in the film deposition process space is not exposed to the plasma. Also, because of the separation by the partitioning wall section, movement of the reactive gas fed into the film deposition process space into the plasma-generating space is restricted sufficiently. Practically, the partitioning wall section has a plurality of through-holes that allow communication between the plasma-generating space and the film deposition process space on each side of the partitioning wall section. Nevertheless, the through-holes are formed with dimensions that satisfy the condition as described above. Therefore, the reactive gas fed into the film deposition process space is prevented or minimized from diffusing back into the plasma-generating space.

In film deposition on the substrate, oxygen gas is used to produce the plasma in the plasma-generating space, and radicals (oxygen-gas active species) and silane or the like, which is the reactive gas, are fed into the film deposition process space to deposit films on the substrate. An example of the films is a silicon oxide film made as a gate-insulating film at a low temperature in the production of liquid crystal displays that use low-temperature polysilicon TFTs. The configuration is made such that the partitioning wall section having the plurality of through-holes and diffusion holes is arranged to separate the interior space of the vacuum vessel into the plasma-generating space and the film deposition process space. In this, the interior space and the diffusion holes that are formed in the partitioning wall section so as to feed the silane or the like directly into the film deposition process space on the front side of the substrate, which is other than the region in which the plasma is produced. Concurrently, the radicals produced in the plasma-generating space are fed into the film deposition process space through the through-holes formed in the partitioning wall section. Also, the dimensions of the through-holes are specified so as to satisfy the specific condition as described above. This minimizes the diffusion of the reactive gas, such as the silane, into the plasma-generating space. The above prevents or minimizes the silane or the like from being mixed directly with the plasma, eliminating or substantially reducing the defects conventionally experienced.

The CVD apparatus described above preferably has the partitioning wall section connected to an RF power supply for feeding a cleaning RF power, in which the RF power is supplied with suitable timing to the partitioning wall section so as to produce a cleaning plasma in the film deposition process space.

The CVD apparatus described above is configured such that the radio-frequency electrode is arranged in a center of the chamber forming the plasma-generating space, and a plasma discharge is generated between the radio-frequency electrode and a part of the vacuum vessel and the partitioning wall section as an electrode surrounding a peripheral region of the radio-frequency electrode. In this configuration, the part of the vacuum vessel and the electrically conductive partitioning wall section are used as the electrode. This allows the arrangement of a plasma producing chamber in which the plasma produced can be sealed, except the through-holes in the partitioning wall section.

The CVD apparatus described above may be configured so that the radio-frequency electrode is arranged on an upper portion of the plasma-generating space for generating the plasma between the radio-frequency electrode and the partitioning wall section. This is a modification of the electrode structure that allows the plasma-producing chamber to be sealed, except the through-holes in the partitioning wall section.

DETAILED DESCRIPTION OF THE PREFERRED EMBODIMENTS

Preferred embodiments of the present invention are described below with reference to the attached drawings.

Figure 1:
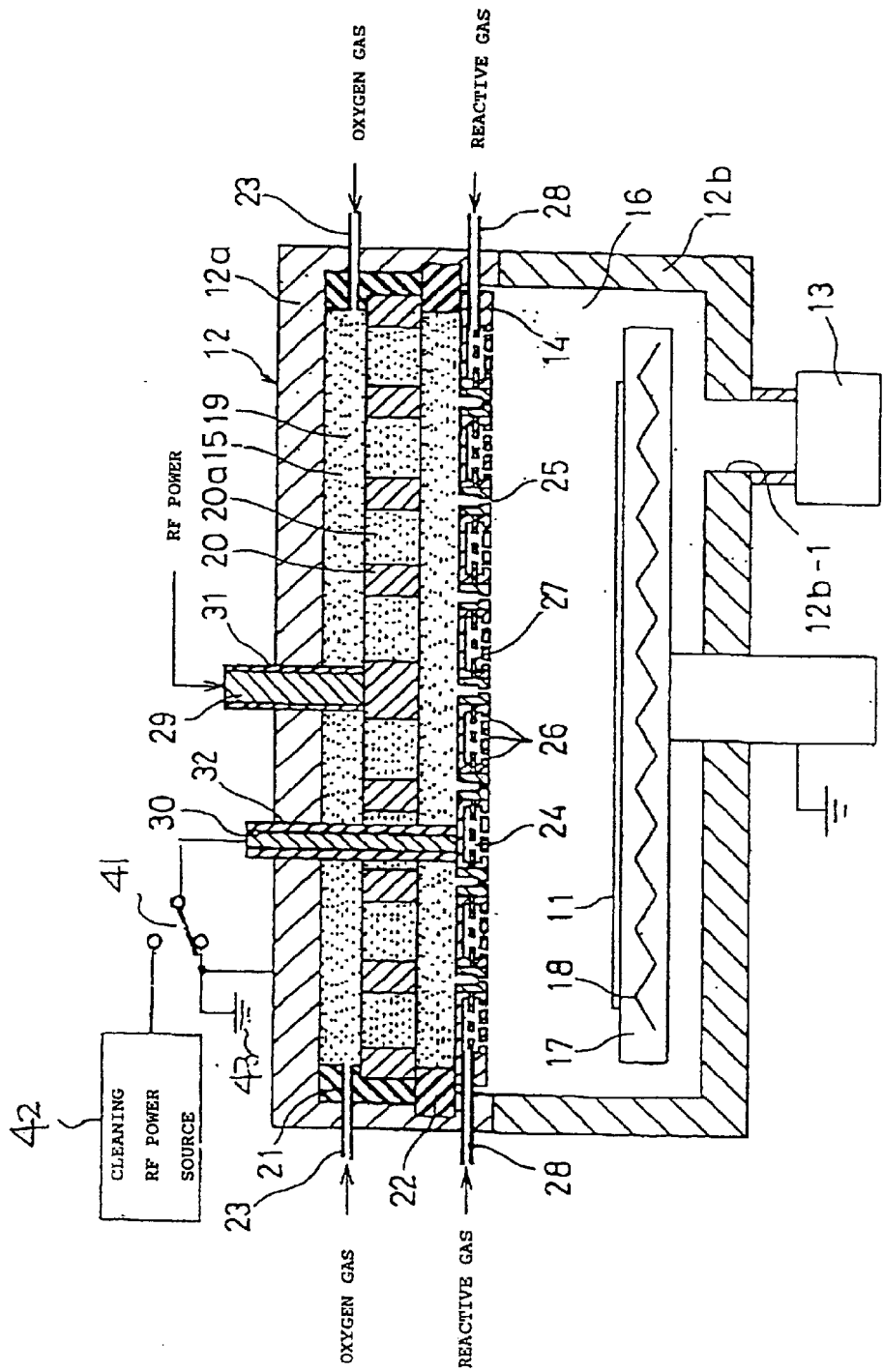
FIG. 1 is a vertical cross-sectional view of a configuration of a first embodiment of the present invention.

In FIG. 1, in the CVD apparatus, silane is preferably used as the reactive gas, and a silicon oxide film is deposited on an upper surface of a glass substrate 11 for a standard TFT as a gate insulating film. A vacuum vessel 12 of the plasma CVD apparatus is maintained in a predetermined vacuum state by use of an exhaust mechanism 13 for deposition of the film. The exhaust mechanism 13 is connected to a discharging port 12b-1 formed in the vacuum vessel 12.

In the vacuum vessel 12, a partitioning wall section 14, made of an electrically conductive material, is arranged in a horizontal state. The partitioning wall section 14 of which the shape is, for example, circular in plan view, is arranged in a manner such that a peripheral section thereof is pressed down by a bottom surface of a lower insulating member 22 so as to form a seal between the vacuum vessel 12 and the partitioning wall section 14. The partitioning wall section 14 separates the inside of the vacuum vessel 12 into two chambers: an upper chamber and a lower chamber. The upper chamber forms a plasma-generating space 15, and the lower chamber forms a film deposition process space 16. The partitioning wall section 14 has a predetermined specific thickness, is substantially planar, and has a plane shape similar to a shape in a horizontally-sectional view of the vacuum vessel 12. Inside the partitioning wall section 14, an interior space 24 is formed.

The glass substrate 11 is arranged on the substrate support mechanism 17 in the film deposition process space 16. The glass substrate 11 is substantially parallel to the partitioning wall section 14 and is arranged in a manner such that a film-deposition surface (upper surface) of the substrate 11 opposes a bottom surface of the partitioning wall section 14. The potential of the substrate support mechanism 17 is maintained at the ground potential, which is the same potential as that of the vacuum vessel 12. Also, a heater 18 is provided within the substrate support mechanism 17. The heater 18 serves to maintain the glass substrate 11 at a predetermined temperature.

So that the assembly characteristics are favorable, the vacuum vessel 12 is composed of an upper vessel 12a forming the plasma-generating space 15 and a lower vessel 12b forming the film deposition process space 16. In assembling the upper vessel 12a and the lower vessel 12b together to form the vacuum vessel 12, the partitioning wall section 14 is provided therebetween. The partitioning wall section 14 is installed in a manner so that a peripheral section thereof contacts the lower insulating member 22. The lower insulating member 22 and an insulating member 21, which are annular, are inserted between the upper vacuum vessel 12a and a planar electrode 20 when it is arranged as described below. In this manner, the plasma-generating space 15 and the film deposition process space 16 that are separated from each other, and are formed on the upper side and the lower side of the partitioning wall section 14, respectively. The plasma-generating space 15 is formed by the partitioning wall section 14 and the upper vessel 12a. In the plasma-generating space 15, a region in which plasma 19 is generated includes the planar electrode 20 (radio-frequency electrode), which is arranged substantially at an intermediate position between the partitioning wall section 14 and the upper vessel 12a. In the electrode 20, a plurality of holes 20a are formed. The partitioning wall section 14 and the electrode 20 are supported by the annular insulating members 21 and 22 and are immobilized thereby. A delivery pipe 23 is provided to the ring-like insulating member 21 for feeding oxygen gas from the outside into the plasma-generating space 15. The delivery pipe 23 is connected to an oxygen gas supply source (not shown) via a mass flow controller that controls the mass flow rate.

Figure 2:
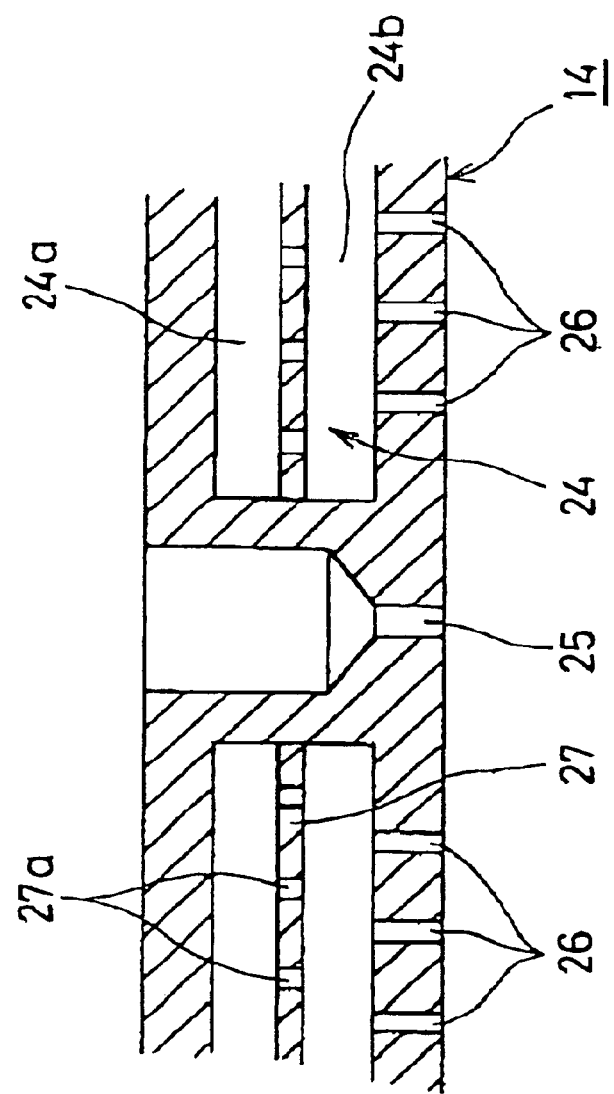
FIG. 2 is an enlarged vertical cross-sectional view of various types of holes formed in a partitioning wall section.

The inside of the vacuum vessel 12 is separated by the partitioning wall section 14 into the plasma-generating space 15 and the film deposition process space 16. However, a plurality of through-holes 25 satisfying a predetermined condition is formed in a distributed manner in the partitioning wall section 14. Only the through-holes 25 allow communication between the plasma-generating space 15 and the film deposition process space 16. Also, an interior space 24 formed inside of the partitioning wall section 14 diffuses the reactive gas so that the gas is fed uniformly into the film deposition process space 16 through a plurality of diffusion holes 26 formed on a bottom wall of the partitioning wall section 14. The individual through-holes 25 and the diffusion holes 26 are made to satisfy the predetermined condition described below. Also, a delivery pipe 28 is connected to the interior space 24 for feeding the reactive gas. The delivery pipe 28 is arranged in a manner so as to be connected in the lateral direction. Also, an equalizing plate 27 is formed to be substantially horizontal in the interior space 24, through which a plurality of holes 27a is formed so that the reactive gas is fed uniformly from the diffusion holes 26. As shown in FIG. 2, the equalizing plate 27 separates the interior space 24 of the partitioning wall section 14 into two space sections 24a and 24b. The reactive gas fed by the delivery pipe 28 into the interior space 24 is fed into the upper space section 24a, travels through the holes 27a, and arrives in the lower space section 24b. The reactive gas further travels through the diffusion holes 26 and diffuses in the film deposition process space 16. The construction described above allows the reactive gas to be fed uniformly into the entire film deposition process space 16.

An enlarged cross sectional view of a hole 25 is shown in FIG. 2. The through-holes 25 are made, for example, to have a large diameter on the side of the plasma-generating space 15 and to have a reduced diameter on the side of the film deposition process space 16.

On an upper internal section of the upper vacuum vessel 12a, there are formed a power supply rod 29 connected to the electrode 20, and a power supply rod 30 connected to the partitioning wall section 14. The power supply rod 29 feeds a discharging RF power to the electrode 20. The electrode 20 functions as a radio-frequency electrode. An outer end section of the power supply rod 30 is selectively connected to either an RF power source 42 for cleaning purposes or to a ground terminal 43 via a switch 41. During film deposition by plasma, the switch 41 is connected to the ground terminal 43 to maintain the partitioning wall section 14 at the ground potential. Also, as described below, cleaning is performed when the switch 41 is connected to the cleaning RF power source 42 with suitable timing to feed a cleaning RF power to the partitioning wall section 14. For reference, the ground terminal 43 is also connected to the upper vessel 12a of the vacuum vessel 12, so that the upper vessel 12a is also maintained at the ground potential. The respective power supply rods 29 and 30 are covered with insulating materials 31 and 32, respectively, so as to be insulated from other metal parts.

Film deposition methods using the above-described CVD apparatus are described below. The glass substrate 11 is transferred into the vacuum vessel 12 by means of a transfer robot (not shown in the drawings) and is disposed on the substrate support mechanism 17. The inside of the vacuum vessel 12 is evacuated by means of the exhaust mechanism 13 and the pressure is reduced and maintained at a predetermined vacuum state. Next, oxygen gas is fed through the delivery pipe 23 into the plasma-generating space 15 of the vacuum vessel 12. The mass flow rate of the oxygen gas at this time is controlled by means of an external mass flow controller. The flow velocity (u) of the oxygen can be obtained using expressions (1) and (2), based on oxygen gas flow rate ($Q_{O2}$), pressure ($P_{O2}$), and temperature (T) of partitioning wall section:

$$Q_{O2} = \rho_{O2}$$

$$P_{O2} = \rho_{O2}$$

Where $\rho_{O2}$
 M: Molecular mass of oxygen
 R: Universal gas constant
 T: Absolute temperature of the partitioning wall section
 A: Total cross sectional area of the smallest diameter portion of the through-holes 25 formed in the partitioning wall section 14
 u: Flow velocity of the oxygen gas flowing through the through-holes 25

On the other hand, the reactive gas, for example, silane, is fed into the vacuum vessel 12 through the delivery pipe 28. The silane is fed into the upper section 24a of the interior space 24, is equalized by means of the equalizing plate 27, travels to the lower space section 24b, and is fed directly, that is, without contacting plasma, to the film deposition process space 16 through the diffusion holes 26. The substrate support mechanism 17, arranged in the film deposition process space 16, is electrically connected to the heater 18. Therefore, the substrate support mechanism 17 is maintained at a predetermined temperature.

In the above state, the RF power supplied to the electrode 20 causes discharge, generating oxygen plasma 19 around the electrode 20 in the plasma-generating space 15. The generation of the oxygen plasma 19 results in the production of radicals (excited active species) which are neutral active species.

The interior of the vacuum vessel 12 is separated into the plasma-generating space 15 and a film deposition process space 16 by means of the partitioning wall section 14, which is formed of an electrically conductive material. With this structure, in deposition of films on a surface of the substrate 11, the plasma-generating space 15 receives the oxygen gas, and concurrently allows the RF power to be fed to the electrode 20 so as to produce the oxygen plasma 19. On the other hand, the film deposition process space 16 receives the silane, which is the reactive gas, which is fed directly into it through the interior space 24 and the diffusion holes 26 of the partitioning wall section 14. Neutral radicals having a long life in the oxygen plasma 19 produced in the plasma-generating space 15 are fed into the film deposition process space 16 through the plurality of through-holes 25. However, a large number of charged particles is lost. The silane travels to the interior space 24 and the diffusion holes 26 of the partitioning wall section 14 so as to be fed directly into the film deposition process space 16. Also, the silane fed directly into the film deposition process space 16 is suppressed to minimize diffusion in the reverse direction toward the plasma-generating space 15 according to the type of the through-holes 25. In this way, the silane, which is the reactive gas, is fed into the film deposition process space 16, and the silane does not contact the oxygen plasma 19 directly. This avoids vigorous reaction between the silane and the oxygen plasma. In the manner as described above, silicon oxide films are deposited on the surface of the glass substrate 11 arranged in a manner so as to oppose the lower surface of the partitioning wall section 14.

In the above configuration, the mass-transfer flow is assumed to be oxygen gas traveling through the through-holes 25 in the plasma-generating space 15. Also, the silane in the film deposition process space 16 is assumed to travel through the through-holes 25 to move toward the plasma generating space 15 and diffuses therein. In this case, features such as the dimensions of the plurality of through-holes 25 of the partitioning wall section 14 are controlled to be within a predetermined range. In particular, for example, D represents the inter-diffusion coefficient regarding the oxygen gas and the silane that are flowing through the through-holes 25 at a temperature of the partitioning wall section 14, the temperature being represented by T; and L represents the length (characteristic length) of the minimum-diameter portion of the through-holes 25. In this case, the features are determined with the gas flow velocity (represented by u) being used so as to satisfy the relation uL/D>1. It is preferable that the above condition regarding the features of the through-holes 25 also be applied similarly to the diffusion holes 26 formed in the partitioning wall section 14.

The relation uL/D>1 is derived as follows. For example, regarding the relation between the oxygen and the silane that are transferring through the through-holes 25, an expression (3) shown below is established by using the silane gas density ($\rho_{SiH4}$ velocity ($u_{SiH4}$), and the inter-diffusion coefficient ($D_{SiH4-O2}$). When the characteristic length of the through-holes is represented by L, the expression (3) can be approximated by expression (4). As a result of a comparison between both sides of the expression (4), the diffusion flow velocity ($u_{SiH4}$) of the silane is expressed by $-D_{SiH4-O2}/L$. Therefore, the oxygen flow velocity, as obtained from the above expressions (1) and (2), is represented by u, and the diffusion flow velocity of the silane is represented by $-D_{SiH4-O2}/L$. The ratio between the absolute values of these two flow velocity values is the value of $|-u/(-D_{SiH4-O2}/L)| = uL/D_{SiH4-O2}$, which represents the ratio between the mass flow velocity of oxygen and the diffusion velocity of silane. Setting the value of $uL/D_{SiH4-O2}$ to exceed 1 means that the flow rate of oxygen due to convection is greater than the flow rate of silane caused by diffusion. That is, the arrangement of the value of $uL/D_{SiH4-O2}$ to exceed 1 means that the diffusion influence of silane is less, and the silane should not pass through the through-holes 25.

$$\rho_{SiH4} \; _{SiH4} \; _{SiH4-O2} \rho_{SiH4}$$

$$\rho_{SiH4} \; _{SiH4} \approx -D_{SiH4-O2} \rho_{SiH4}$$

Next, a particular example is described below. The above expressions will produce a value of $uL/_{DSiH4-O2}$ as equal to 11 in the following case: the temperature in the partitioning wall section 14 is 300° C., the smallest diameter of the through-hole 25 formed in the partitioning wall section 14 is 0.5 mm, the length (L) of a portion of the diameter 0.5 mm is 3 mm, the total number of through-holes 25 is 500, the flow rate of oxygen gas is 500 sccm, and the pressure in the film deposition process space 16 is 100 Pa. This indicates that, compared to the diffusion of the silane gas, since the flow influence is very large, the diffusion of the silane gas into the plasma-generating space 15 is reduced.

The plasma-generating space 15 and the film deposition process space 16 described above are separated by the partitioning wall section 14 in which a large number of through-holes 25 and diffusion holes 26 is formed so that they are respectively sealed chambers. Therefore, there is almost no contact between the silane fed directly in the film deposition process space 16 and the oxygen plasma. This avoids vigorous reaction between the silane and the oxygen plasma which occurs in conventional apparatuses.

Next, cleaning of the film deposition process space 16 is described below. According to the CVD apparatus of this embodiment, a problem arises in that the plasma does not diffuse sufficiently into the film deposition process space 16, causing difficulty in cleaning the film deposition process space 16. For solving this problem, in the arrangement in which the power supply rod 30 is electrically connected to the partitioning wall section 14, and the switch 41 is connected to the cleaning RF power source 42, as described above, a plasma such as an $NF_3$ plasma is produced in the film deposition process space 16 by using RF power fed from the cleaning RF power source 42. The plasma produced is used to clean the interior of the film deposition process space 16. When the time required for cleaning is not important, cleaning can be performed so that discharge is not performed in the film deposition process space 16, the $NF_3$ plasma is produced in the plasma-generating space 15, and fluorine radicals traveled through the through-holes 25 in the partitioning wall section 14 and diffused in the film deposition process space 16 are used. In this case, the switch 41 is connected to the ground terminal 43 to ground the partitioning wall section 14. The cleaning is performed with appropriate timing according to criteria established on a basis such as predetermined time intervals or time intervals for a predetermined number of substrates.

Figure 3:
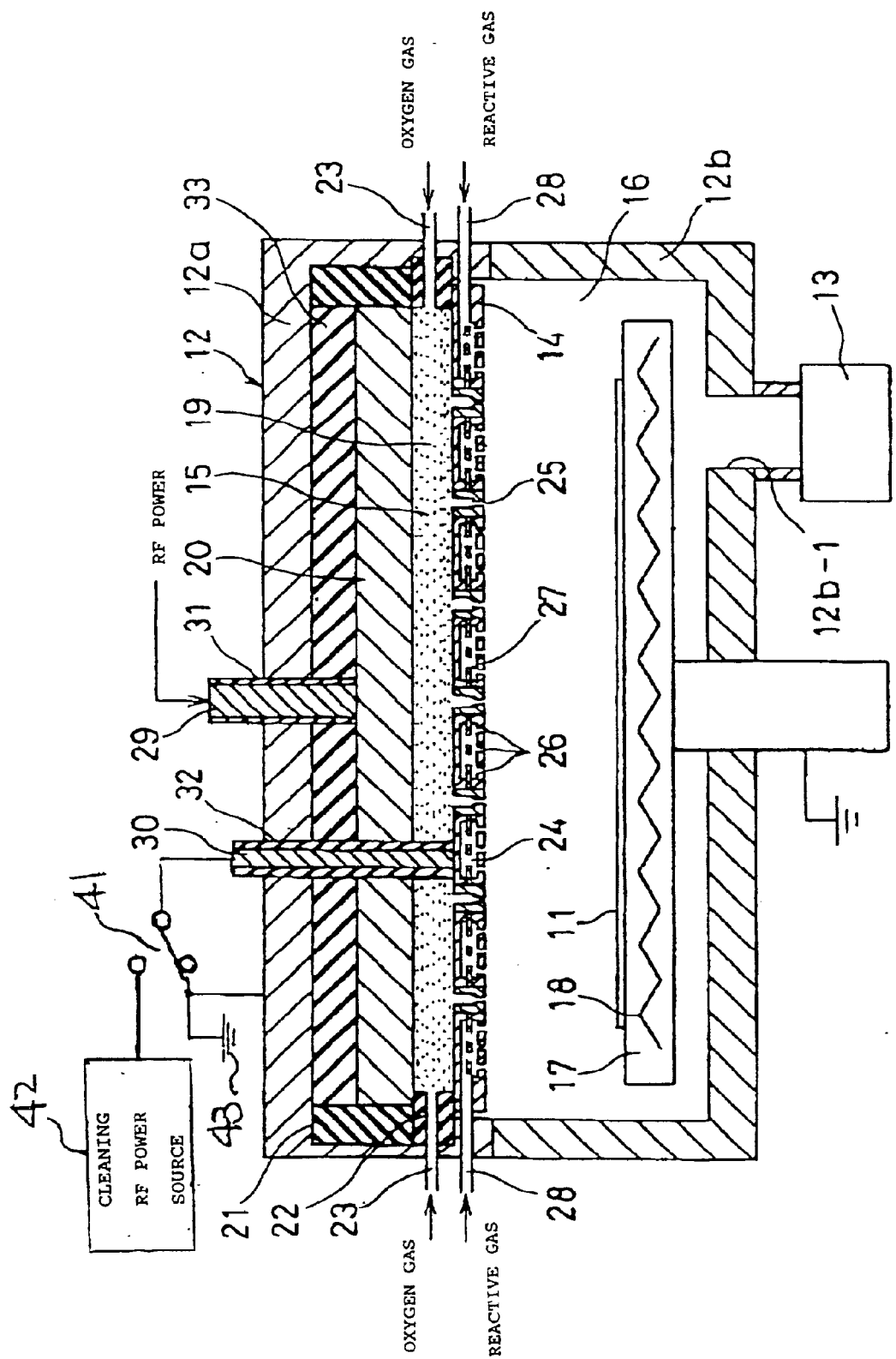
FIG. 3 is a vertical cross-sectional view of a second embodiment of the present invention.

Next, referring to FIG. 3, a second embodiment of the plasma CVD apparatus according to the present invention is described below. In FIG. 3, the same symbols are provided for parts that are substantially the same as those in FIG. 1, and repetition of detailed explanations is avoided. This embodiment includes a disc-shaped insulating member 33 arranged inside an upper internal section of an upper vessel 12a, and an electrode 20 is arranged thereunder. The electrode 20 has no holes, such as the holes 20a described above, and is one-plate shaped. The electrode 20 and a partitioning wall section 14 define a plasma-generating space 15 in a parallel-flat-plate type electrode structure. The other aspects of configuration are substantially the same as those in the configuration of the first embodiment.

The above embodiments are described in a case in which silane is used as a reactive gas, but there is no such a restriction thereto, and other reactive gases such as TEOS may be used instead of silane. Furthermore, the embodiments are applicable not only to deposition of the silicon oxide films but to deposition of other types of films such as silicon nitride films. The principle concept of the present invention may be applied to all types of processing in which problems arise in that dust particles are generated as a result of contact between plasma and a reactive gas, and ions are implanted into a substrate. The applicable types of processing include film deposition, surface treatments, processing and isotropic etching.

As is clear from the above description, the present invention has a partitioning wall section in which a plurality of through-holes and diffusion holes that meet the predetermined condition are formed. The partitioning wall section separates the inside of the vacuum vessel into a plasma-generating space and a film deposition process space. This allows the active species produced in the plasma-generating space to feed into the film deposition process space through the through-holes of the partitioning wall section. Also, the reactive gas is allowed to travel through the interior space and the diffusion holes of the partitioning wall section to feed directly into the film deposition process space, without contacting the plasma. Therefore, in deposition of films such as silicon oxide films by using the plasma CVD with a reactive gas such as silane on a large-surface substrate, a vigorous chemical reaction between the reactive gas and the plasma can be avoided. As a result, formation of dust particles can be suppressed, and implantation of ions into the substrate can be avoided.

Furthermore, the reactive gas can be uniformly fed, and concurrently, radicals of the oxygen gas can also be fed to the film deposition process space by means of the plurality of the through-holes formed in the partitioning wall section. This improves distribution of the radicals, the silane, and the like, in the vicinity of the substrate surface, allowing effective deposition of films on large-surface substrates.

Furthermore, the rod for the cleaning-purpose power is connected to the partitioning wall section so that the power is fed to perform cleaning. Therefore, even with the plasma-generating space and the film deposition process space which are formed separately from each other, cleanliness in the film deposition process space can be suitably maintained.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A CVD apparatus comprising:
    a vacuum vessel having an inside in which plasma is produced to generate active species, and film deposition is performed on a substrate by using the active species and a reactive gas;
    an electrically-conductive partitioning wall section formed in the vacuum vessel for separating the inside thereof into two chambers;
    a first one of the two chambers is formed as a plasma-generating space and contains a radio-frequency electrode;
    a second one of the two chambers is formed as a film deposition process space and contains a substrate support mechanism for mounting a substrate;
    the partitioning wall section includes a plurality of through-holes to allow communication between the plasma-generating space and the film deposition process space;
    the partitioning wall section includes an interior space separated from the plasma-generating space and communicating with the film deposition process space through a plurality of diffusion holes;
    means for delivering into the interior space a reactive gas supplied from outside the vacuum vessel, whereby the reactive gas thus supplied into the interior space is fed to the film deposition process space through the plurality of diffusion holes;
    means for delivering a first gas to the plasma-generating space so that it passes through the through-holes at velocity u such that an equation $uL/D<1$ is satisfied where L represents an effective length of the through-holes and D represents an inter-diffusion coefficient between the first gas and the reactive gas; and
    means for supplying an RF power to the radio-frequency electrode for generating a plasma discharge in the plasma-generating space, by which the active species produced in the plasma-generating space are fed into the film deposition process space via the plurality of through-holes formed in the partitioning wall section.

2. The CVD apparatus as stated in claim 1, wherein the diffusion holes satisfy the requirements of $uL/D>1$, where u represents the gas flow velocity in the holes, L represents the effective hole length, and D represents the inter-diffusion coefficient.

3. The CVD apparatus as stated in claim 1, wherein the interior space of the partitioning wall section comprises a diffusing structure of at least two layers for diffusing the reactive gas uniformly in the interior space.

4. The CVD apparatus as stated in claim 2, wherein the interior space of the partitioning wall section comprises a diffusing structure of at least two layers for diffusing the reactive gas uniformly in the interior space.

5. A CVD apparatus as stated in claim 1, further comprising an RF power supply for feeding a cleaning RF power and means for connecting the partitioning wall section to the RF power supply with suitable timing so as to produce a cleaning plasma in the film deposition process space.

6. A CVD apparatus as stated in claim 2, further comprising an RF power supply for feeding a cleaning RF power and means for connecting the partitioning wall section to the RF power supply with suitable timing so as to produce a cleaning plasma in the film deposition process space.

7. A CVD apparatus as stated in claim 3, further comprising an RF power supply for feeding a cleaning RF power and means for connecting the partitioning wall section to the RF power supply with suitable timing so as to produce a cleaning plasma in the film deposition process space.

8. A CVD apparatus as stated in claim 4, further comprising an RF power supply for feeding a cleaning RF power and means for connecting the partitioning wall section to the RF power supply with suitable timing so as to produce a cleaning plasma in the film deposition process space.

9. A CVD apparatus as stated in claim 1, wherein the radio-frequency electrode is arranged in a center of the first one of the two chambers, and a plasma discharge is generated between (a) the radio-frequency electrode and (b) a part of the vacuum vessel and the partitioning wall section as an electrode surrounding a peripheral region of the radio-frequency electrode.

10. A CVD apparatus as stated in claim 2, wherein the radio-frequency electrode is arranged in a center of the first one of the two chambers, and a plasma discharge is generated between (a) the radio-frequency electrode and (b) a part of the vacuum vessel and the partitioning wall section as an electrode surrounding a peripheral region of the radio-frequency electrode.

11. A CVD apparatus as stated in claim 3, wherein the radio-frequency electrode is arranged in a center of the first one of the two chambers, and a plasma discharge is generated between (a) the radio-frequency electrode and (b) a part of the vacuum vessel and the partitioning wall section as an electrode surrounding a peripheral region of the radio-frequency electrode.

12. A CVD apparatus as stated in claim 4, wherein the radio-frequency electrode is arranged in a center of the first one of the two chambers, and a plasma discharge is generated between (a) the radio-frequency electrode and (b) a part of the vacuum vessel and the partitioning wall section as an electrode surrounding a peripheral region of the radio-frequency electrode.

13. A CVD apparatus as stated in claim 5, wherein the radio-frequency electrode is arranged in a center of the first one of the two chambers, and a plasma discharge is generated between (a) the radio-frequency electrode and (b) a part of the vacuum vessel and the partitioning wall section as an electrode surrounding a peripheral region of the radio-frequency electrode.

14. A CVD apparatus as stated in claim 6, wherein the radio-frequency electrode is arranged in a center of the first one of the two chambers, and a plasma discharge is generated between (a) the radio-frequency electrode and (b) a part of the vacuum vessel and the partitioning wall section as an electrode surrounding a peripheral region of the radio-frequency electrode.

15. A CVD apparatus as stated in claim 1, wherein the radio-frequency electrode is arranged on an upper portion of the plasma-generating space for generating a plasma discharge between the radio-frequency electrode and the partitioning wall section.

16. A CVD apparatus as stated in claim 2, wherein the radio-frequency electrode is arranged on an upper portion of the plasma-generating space for generating a plasma discharge between the radio-frequency electrode and the partitioning wall section.

17. A CVD apparatus comprising:
a vacuum vessel having an inside in which plasma is produced to generate active species, and film deposition is performed on a substrate by using the active species and a reactive gas;
an electrically-conductive partitioning wall section formed in the vacuum vessel for separating the inside thereof into two chambers;
a first one of the two chambers is formed as a plasma-generating space and contains a radio-frequency electrode;
a second one of the two chambers is formed as a film deposition process space and contains a substrate support mechanism for mounting a substrate;
the partitioning wall section includes a plurality of through-holes to allow communication between the plasma-generating space and the film deposition process space;
the partitioning wall section includes an interior space separated from the plasma-generating space and communicating with the film deposition process space through a plurality of diffusion holes;
a device for delivering into the interior space a reactive gas supplied from outside the vacuum vessel, whereby the reactive gas thus supplied into the interior space is fed to the film deposition process space through the plurality of diffusion holes;
a device for delivering a first gas to the plasma-generating space so that it passes through the through-holes at velocity u such that an equation $uL/D>1$ is satisfied where L represents a length of a minimum diameter portion of the through-holes and D represents an inter-diffusion coefficient between the first gas and the reactive gas; and
a device for supplying an RF power to the radio-frequency electrode for generating a plasma discharge in the plasma-generating space, by which the active species produced in the plasma-generating space are fed into the film deposition process space via the plurality of through-holes formed in the partitioning wall section.

18. The CVD apparatus as stated in claim 17, wherein the diffusion holes satisfy the requirements of $uL/D>1$, where u represents the gas flow velocity in the holes, L represents the effective hole length, and D represents the inter-diffusion coefficient.

19. The CVD apparatus as stated in claim 17, wherein the interior space of the partitioning wall section comprises a diffusing structure of at least two layers for diffusing the reactive gas uniformly in the interior space.

20. A CVD apparatus as stated in claim 17, further comprising an RF power supply for feeding a cleaning RF power and means for connecting the partitioning wall section to the RF power supply with suitable timing so as to produce a cleaning plasma in the film deposition process space.

21. A CVD apparatus as stated in claim 17, wherein the radio-frequency electrode is arranged in a center of the first one of the two chambers, and a plasma discharge is generated between (a) the radio-frequency electrode and (b) a part of the vacuum vessel and the partitioning wall section as an electrode surrounding a peripheral region of the radio-frequency electrode.

22. The CVD apparatus as claimed in claim 17, wherein the first gas is oxygen.

23. A CVD apparatus as stated in claim 1, further comprising an RF power supply for feeding a cleaning RF power and a switch for connecting the partitioning wall section to the RF power supply with suitable timing so as to produce a cleaning plasma in the film deposition process space.

24. The CVD apparatus as claimed in claim 17, wherein the device for delivering the first gas includes a mass flow controller.

25. A CVD apparatus in claim 5, wherein the connecting means includes a switch which selectively connects the partitioning wall to the RF power supply for feeding a cleaning RF power and to a ground for cleaning using the RF power supplied to the radio-frequency electrode in the first chamber.

26. A CVD apparatus as stated in claim 25, wherein the switch includes a first station for connecting the partitioning wall to the RF power supply for feeding a cleaning RF power and a second station for connecting the partitioning wall to a ground for cleaning using RF power supplied to the radio-frequency electrode in the first chamber.

27. A CVD apparatus as stated in claim 17, further comprising an RF power supply for feeding a cleaning RF power and a switch for connecting the partitioning wall section to the RF power supply with suitable timing so as to produce a cleaning plasma in the film deposition process space.

28. A CVD apparatus as stated in claim 20, wherein the connecting means includes a switch which selectively connects the partitioning wall to the RF power supply for feeding a cleaning RF power and to a ground for cleaning using the RF power supplied to the radio-frequency electrode in the first chamber.

29. A CVD apparatus as stated in claim 28, wherein the switch includes a first station for connecting the partitioning wall to the RF power supply for feeding a cleaning RF power and a second station for connecting the partitioning wall to a ground for cleaning using the RF power supplied to the radio-frequency electrode in the first chamber.

30. A CVD apparatus as stated in claim 1, further comprising a circuit for connecting the partitioning wall to ground while a cleaning power is applied to the radio-frequency electrode so as to produce a cleaning plasma in the film deposition process space.

31. A CVD apparatus as claimed in claim 1, wherein the effective length is a length of a minimum diameter portion of the through-holes.

* * * * *